(12) United States Patent
Nakagawara (10) Patent No.: US 6,486,695 B1
(45) Date of Patent: Nov. 26, 2002

(54) PROTECTING UNIT

(75) Inventor: Chikashi Nakagawara, Yokohama (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 09/546,558

(22) Filed: Apr. 10, 2000

(30) Foreign Application Priority Data

Apr. 14, 1999 (JP) .......................................... 11-106594

(51) Int. Cl.[7] .............................................. H03K 9/007
(52) U.S. Cl. ............................ 326/14; 326/13; 326/86; 326/90; 327/65; 327/77; 327/175
(58) Field of Search .............................. 326/14, 13, 86; 327/77–79, 65, 175; 347/105, 145, 162, 180, 237

(56) References Cited

U.S. PATENT DOCUMENTS

| | | | | |
|---|---|---|---|---|
| 5,894,423 A | * | 4/1999 | Ling et al. .............. | 364/528.28 |
| 6,066,972 A | * | 5/2000 | Strom ......................... | 327/175 |
| 6,288,577 B1 | * | 9/2001 | Wong .......................... | 327/65 |
| 6,320,406 B1 | * | 11/2001 | Morgan et al. ................ | 326/14 |

FOREIGN PATENT DOCUMENTS

| | | |
|---|---|---|
| JP | 2-154122 | 6/1990 |
| JP | 5-75430 | 3/1993 |
| JP | 5-340825 | 12/1993 |
| JP | 6-180806 | 6/1994 |

* cited by examiner

Primary Examiner—Michael Tokar
Assistant Examiner—Vibol Tan
(74) Attorney, Agent, or Firm—Oblon, Spivak, McClelland, Maier & Neustadt, P.C.

(57) ABSTRACT

A protecting unit is provided. The protecting unit can prevent accidents from occurring that become problems when data are transmitted due to for instance LVDS and for instance laser light is emitted based on the data. The protecting unit is applied in an instrument comprising an input end to which differential signal is transmitted, the input end being attachable to and detachable from an input line. Here, the voltage at the input end when the input line is not connected is set to a voltage different from that generated at the input end when the input line is connected, variation of the voltage at the input end is transmitted to an input terminal of a differential input/output circuit, and the voltage at the input end or a portion corresponding thereto is compared with a prescribed voltage to fix a state of output of the differential input/output circuit to a prescribed state based on the compared results.

20 Claims, 6 Drawing Sheets

PROTECTING UNIT

BACKGROUND OF THE INVENTION

1. Field of the Invention

The present invention relates to a protecting unit for preventing an accident particularly during an extraordinary state from occurring in an electronic instrument using for instance laser.

2. Description of the Related Art

In PPCs (Plain Paper Copiers) and laser printers, printing is carried out with laser light of a laser diode. The laser light is irradiated onto for instance portions to be printed of a pre-charged roller to eliminate charges of the portions irradiated by the laser light. Toner is absorbed by the roller. Thereafter, the toner existing on the portions to which the laser light is irradiated is transferred onto paper. The transferred toner is printed on the paper by means of heat fusing.

Laser printing can give relatively crisp images and is suitable for high-speed printing. Accordingly, there is a strong demand for business use where a large volume and highspeed printing are necessary. Recently in particular, demand for high-speed printing is stronger.

In this case, transfer of printing data from an image processor to a laser driver becoming very fast, data transmission is switching from existing one due to TTL (Transistor-Transistor Logic) to another one due to LVDS (Low Voltage Differential Signal) suitable for high-speed data transmission.

Figure 6:
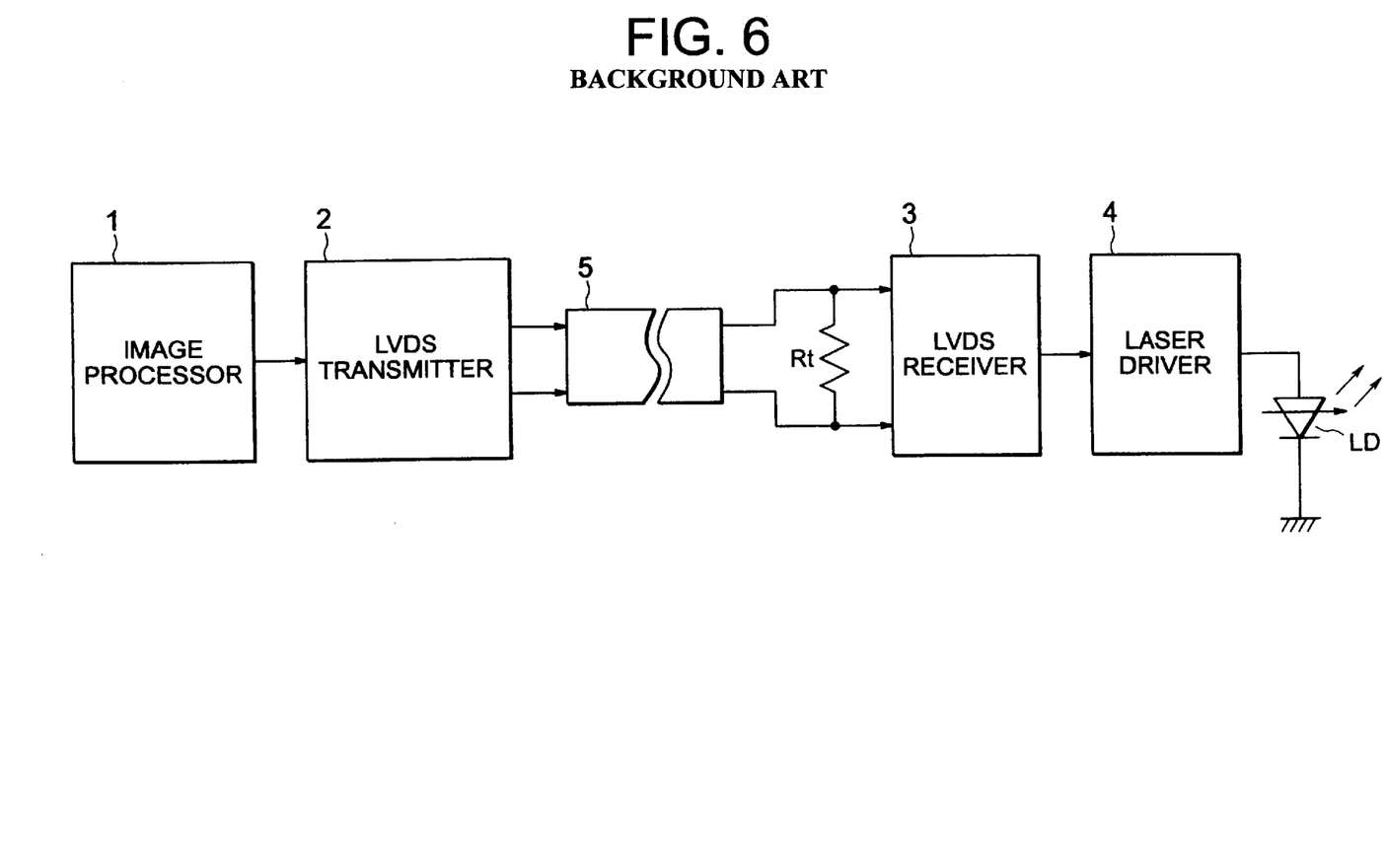
FIG. 6 is a system block diagram for explaining how to drive a laser diode with transmitting means due to general LVDS standard.

US IEEE (The Institute of Electrical and Electronics Engineers, Inc.) has provided the LVDS as IEEE1596.3. As shown in FIG. 6, data transmission is executed with small amplitude differential signals.

That is, in the PPC and laser printer, as shown in FIG. 6, a LVDS transmitter 2, a LVDS receiver 3 and a cable 5 connecting therebetween, connects between an image processor 1 and a laser driver 4.

Figure 7:
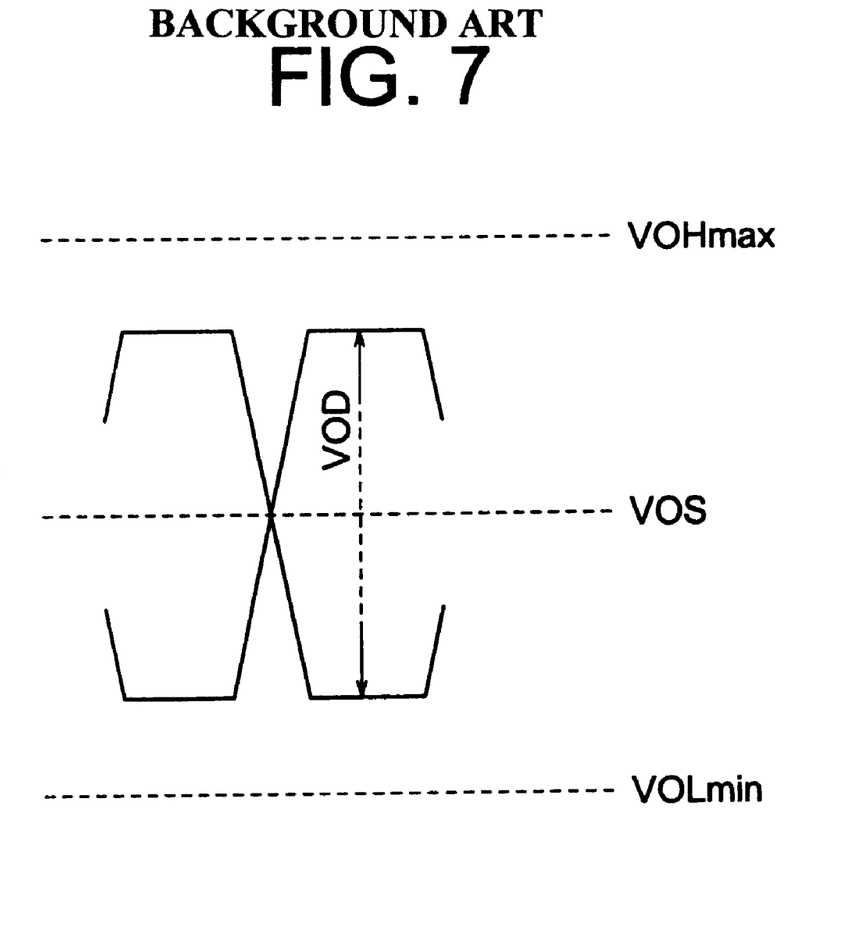
FIG. 7 is a diagram for explaining about LVDS standard.

As shown in FIG. 7, when terminal resistance Rt connected to a differential input terminal of the LVDS receiver 3 is 100 Ω, an off-set voltage $V_{OS}$ of the differential input terminal of the LVDS receiver 3 is 1.125V to 1.275V, differential amplitude $V_{OD}$ being $0.25V_{P-P}$ to $0.4V_{P-P}$, the upper limit of an output voltage $VOH_{MAX}$ being 1.475V, the lower limit of that $VOL_{MIN}$ being 0.925V.

Accordingly, relative to an existing TTL level of 5 $V_{P-P}$, the amplitude being approximately one tenth thereof, data can be easily transmitted faster approximately ten times than that of the existing one, accordingly. Though the LVDS is suitable for the high-speed transmission, when used in the data transmission from the image processor to the laser driver, there occurs a big problem.

Ordinarily, for the PPCs and laser printers, from their structures, maintenance is indispensable. During maintenance operation, since the respective portions are necessary to be checked and adjusted in operation, it is necessary to open a cover without turning off the power source. At this time, in order to prevent an accident due to the laser light from occurring, the image processor 1 instructs the laser driver 4 to set data so that the laser does not emit. However, sometimes the cable connecting between the LVDS transmitter 2 and the LVDS receiver 3 may be disconnected.

Here, the input terminal of the LVDS receiver 3, being open, becomes indefinite as a state of input data. Accordingly, in the worst case situation, the laser is always in an emitting state to result in liability to serious accidents.

In order to avoid this from happening, the data transmission due to, other than the differential signal such as the LVDS, unbalanced signal such as the existing TTL signal can be implemented. However, the high-speed transmission becomes difficult.

Thus, when with the aforementioned existing LVDS, signal that drives the laser diode is transmitted/received, a serious accident may occur. On the other hand, when the unbalanced signal, instead of the LVDS, is used in the data transmission, the high-speed data transmission can not be realized.

The present invention is to provide a protecting unit that can prevent an accident, which becomes problems when the data are transmitted due to for instance the LVDS and based on the data for instance laser light is generated, from occurring.

SUMMARY OF THE INVENTION

To solve the aforementioned problems, the present invention discloses a protecting unit applied in an instrument comprising an input end to which differential signal, which is supplied to a differential input/output circuit, is transmitted, the input end being attachable to and detachable from an input line. The protecting unit comprises a circuit, and a comparator. The circuit sets a voltage of the input end when the input line is not connected to a voltage different from that generated at the input end when the input line is connected. The comparator compares a voltage of the input end with a reference voltage. Here, a state of output of the differential input/output circuit is fixed to a prescribed state based on the compared result.

Further, the present invention discloses a protecting unit applied in an instrument comprising an input end to which differential signal, which is supplied to a differential input/output circuit, is transmitted, the input end being attachable to and detachable from an input line. The protecting unit comprises a circuit, a node for detecting a voltage of the input end, and a comparator. The circuit sets a voltage of the input end when the input line is not connected to a voltage different from that generated at the input end when the input line is connected. The comparator compares a voltage at the node with a reference voltage. Here, a state of output of the differential input/output circuit is fixed to a prescribed state based on the compared result.

Still further, the present invention discloses a protecting unit applied in an instrument comprising an input end to which differential signal is transmitted, the input end being attachable to and detachable from an input line. The protecting unit comprises a bias circuit, a transmitter for transmitting variation of voltage at the input end to an input terminal of a differential input/output circuit, and a comparator. The bias circuit sets a voltage of the input end when the input line is not connected to a voltage different from that generated at the input end when the input line is connected. The comparator compares a voltage of the input terminal of the differential input/output circuit with a reference voltage. Here, a state of output of the differential input/output circuit is fixed to a prescribed state based on the compared result.

Thereby, an instrument comprising a differential input/output circuit that converts data inputted to a receiver input end that receives data transmitted from a transmitter transmitting differential signal to a prescribed output detects the input end of a receiver side to be opened. Thereby, if opened, output of the differential input/output circuit can be controlled.

Accordingly, when the present invention is applied in an electronic instrument using for instance laser, even if the cable is disconnected during maintenance operation, the laser can be instantly turned off to a non-emitting state. Thereby, occurrence of a serious accident due to laser light can be prevented.

DESCRIPTION OF PREFERRED EMBODIMENTS

In the present invention, as a preferable example, the aforementioned differential signal is LVDS (Low Voltage Differential Signal) of IEEE standard.

In another preferable example, the aforementioned circuit exists at least at one end of a pair of the input ends, the comparator comparing a voltage of the node disposed to at least one side of the input end pair.

In still another preferable example, the circuit comprises a voltage source and a resistance connected to the voltage source.

In further preferable example, the circuit comprises a current source.

In still further preferable example, the circuit sets the voltage of the input end when the input line is not connected to a voltage higher than a maximum of the voltages generated at the input end when the input line is connected. The comparator compares the voltage at the input end or the node with a value that is between the set voltage value and the maximum voltage value generated at the input end when the input line is connected as a value of the reference voltage.

In another preferable example, the transmission circuit includes a current-voltage converter.

In still another preferable example, the current voltage converter is a common base amplifier.

In another preferable example, the bias circuit includes a voltage source connected to the base of the common base amplifier.

In further preferable example, between both phases of the differential signal a resistance is inserted.

In still further preferable example, output of the differential input/output circuit is used to drive a laser diode.

Figure 1:
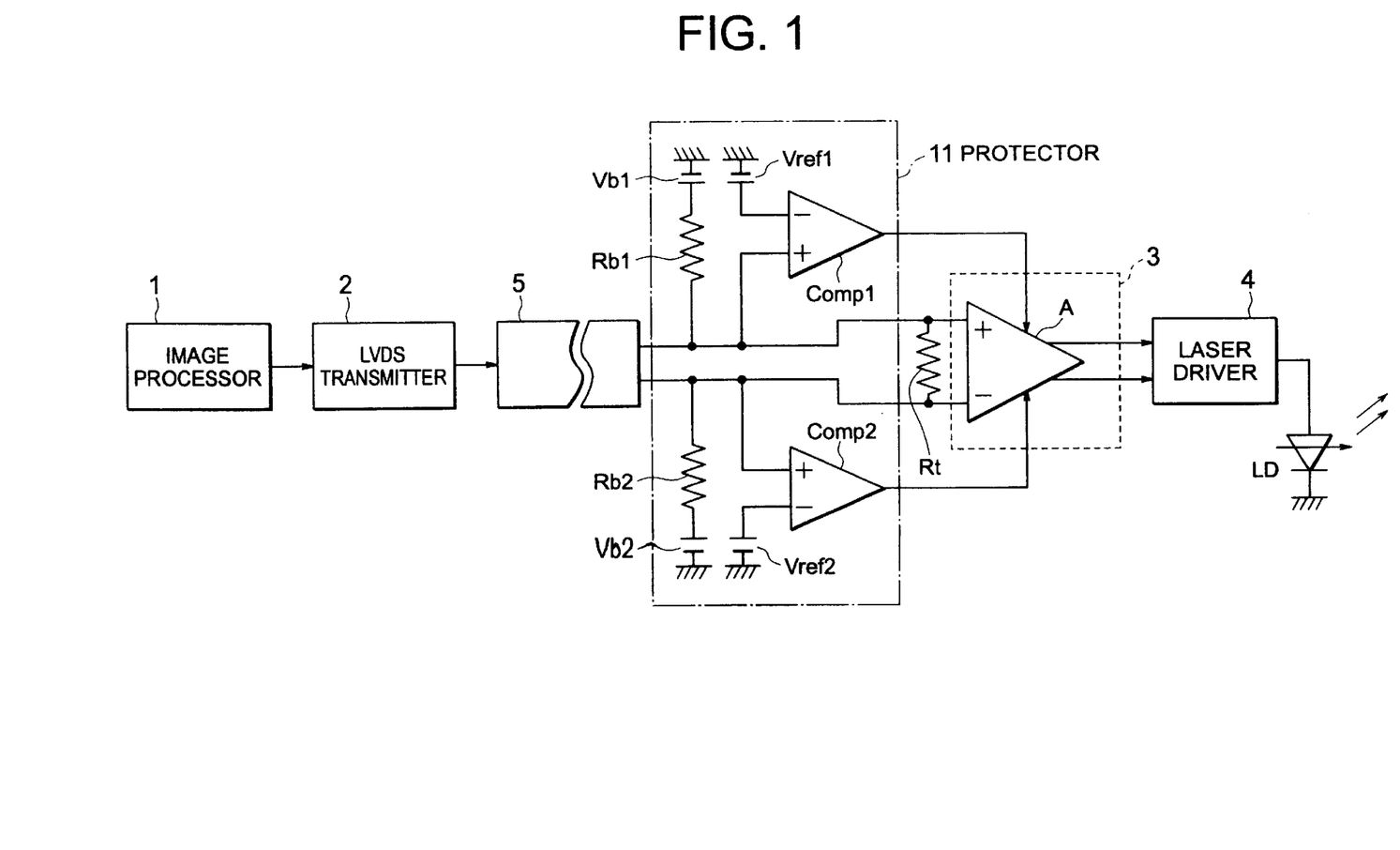
FIG. 1 is a system diagram for explaining a first embodiment of the present invention.

In the following, embodiments of the present invention will be explained in more detail with reference to the drawings. FIG. 1 is a system diagram for explaining a first embodiment of the present invention. Further, in FIG. 1, constituents identical with those of FIG. 6 are given the same reference numerals to explain.

In FIG. 1, an image processor 1 processes image information such as read-in characters to convert into printing data. The printing data are supplied to a LVDS transmitter 2.

The LVDS transmitter 2 converts the printing data into balanced signal of small signal amplitude, the converted printing data being supplied to a LVDS receiver 3 and a protector 11 through a cable 5. That is, the converted printing data are supplied to the protector 11 and at the same time to the LVDS receiver 3 constituted of a differential input/output amplifier A. Output of the LVDS receiver 3 is supplied to a laser driver 4, a laser diode LD being driven by the laser driver 4. A terminal resistance Rt is connected to the differential input terminal of the LVDS receiver 3.

The protector 11 disposed between the cable 5 and the LVDS receiver 3 comprises a bias circuit and a comparator. The bias circuit comprises voltage sources Vb1 and Vb2 connected to positive and negative input terminals of the LVDS receiver 3 through resistances Rb1 and Rb2, respectively. The comparator comprises comparators Comp 1 and Comp 2 in which the positive and negative input terminals of the LVDS receiver 3 are non-inversion inputs and reference voltage sources Vref1 and Vref2 are connected to inversion inputs, respectively. Output voltages of the comparators Comp 1 and Comp 2 control the state of output of the differential input/output amplifier A.

Figure 2:
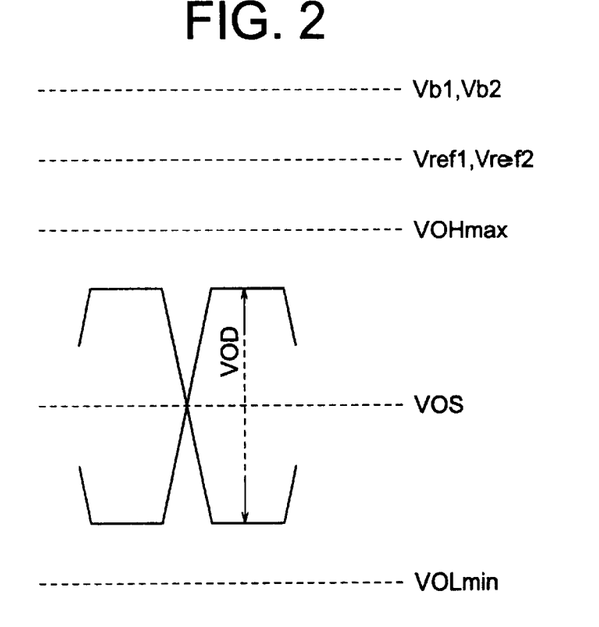
FIG. 2 is a diagram for explaining the operation of FIG. 1.

The voltages of the bias circuit and the comparator in the protector 11 are set as shown in FIG. 2. That is, the bias voltage sources Vb1 and Vb2 are set to be the upper limit $VOH_{MAX}$ of LVDS output voltage or more, and the resistances Rb1 and Rb2 are set to be a sufficiently larger resistance value than that of the terminal resistance Rt. The reference voltage sources Vref1 and Vref2 of the comparators Comp 1 and Comp 2 are set at an appropriate voltage between the upper limit $VOH_{MAX}$ of the output voltage and the bias voltage sources Vb1 and Vb2.

By setting thus, when an input terminal of the LVDS receiver 3 is open, input end voltages become approximately bias voltages Vb1 and Vb2. On the other hand, when the input end is normally connected to the LVDS transmitter 2, the input end voltages become voltages between the lower limit of the LVDS output voltage $VOL_{MIN}$ and the upper limit $VOH_{MAX}$ thereof.

Accordingly, with respect to the reference voltages Vref1 and Vref2 set between the upper limit $VOH_{MAX}$ of the LVDS output voltage during normal operation and the bias voltages Vb1 and Vb2 during an open state, the input end voltages are compared at the comparators Comp1 and Comp2. Thereby, whether the input end is an open state or normally connected can be detected. Based on the detected results, the outputs of the differential input/output amplifier A are controlled so that the laser diode LD becomes a non-emitting state, thereby resulting in preventing accidents due to the laser light from occurring.

The bias voltages Vb1 and Vb2 and the reference voltage sources Vref1 and Vref2 can be made common, respectively. In the present embodiment, the positive and negative input terminals of the LVDS receiver 3 each can be detected to be an open state. However, since the balancing line inputted in the LVDS receiver 3 is connected by the terminal resistance Rt of a low value, even if the input terminal is opened, the difference of voltages of the input ends thereof is very small. Accordingly, either one of positive or negative input end alone can be detected to be open.

Figure 3:
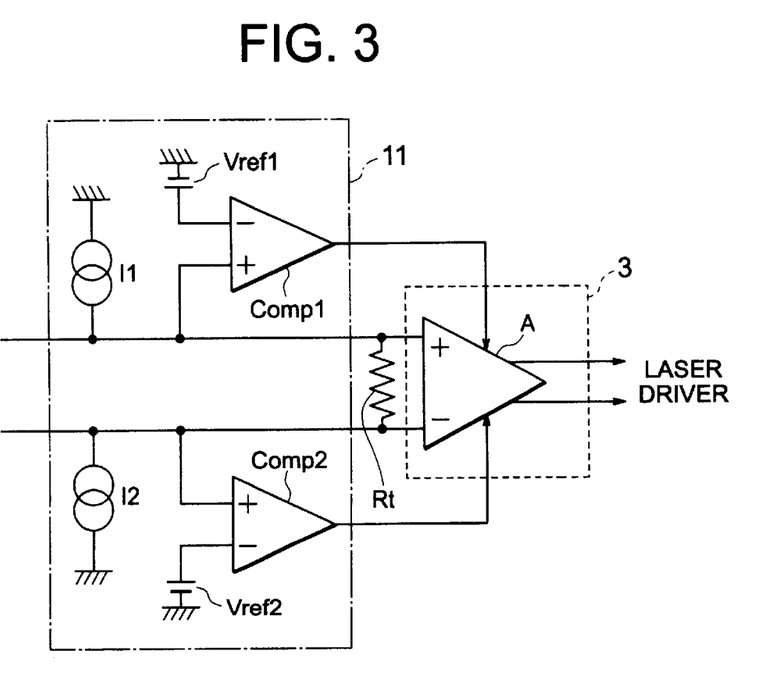
FIG. 3 is a circuit configuration diagram for explaining a second embodiment of the present invention.

FIG. 3 is a circuit diagram for explaining a second embodiment of the present invention. In the present embodiment, in FIG. 1, only the bias circuits that are constituted of the resistance Rb1 and voltage source Vb1 of the protector 11, and resistance Rb2 and voltage source Vb2 thereof respectively are changed to current sources I1 and I2.

In FIG. 3, only the protector 11 and the LVDS receiver 3 are shown for explanation.

Upon constituting thus, compared with the case of FIG. 1, an input impedance seeing in the differential input/output amplifier A side from the input end increases. In this case, when the input end becomes an open state, due to action of the current sources I1 and I2, the voltage at the input terminal of the LVDS receiver 3 becomes to the upper limit (for instance, source voltage of the protector 11). Since the range of variation between during being open and during being normal becomes larger, detection can be implemented more surely.

In the present embodiment too, the reference voltage sources Vref1 and Vref2 can be made common. Though the positive and negative input terminals of the LVDS receiver 3 each can be detected to be an open state in the present embodiment, only either one of the positive or negative terminals can be detected to be an open state.

Figure 4:
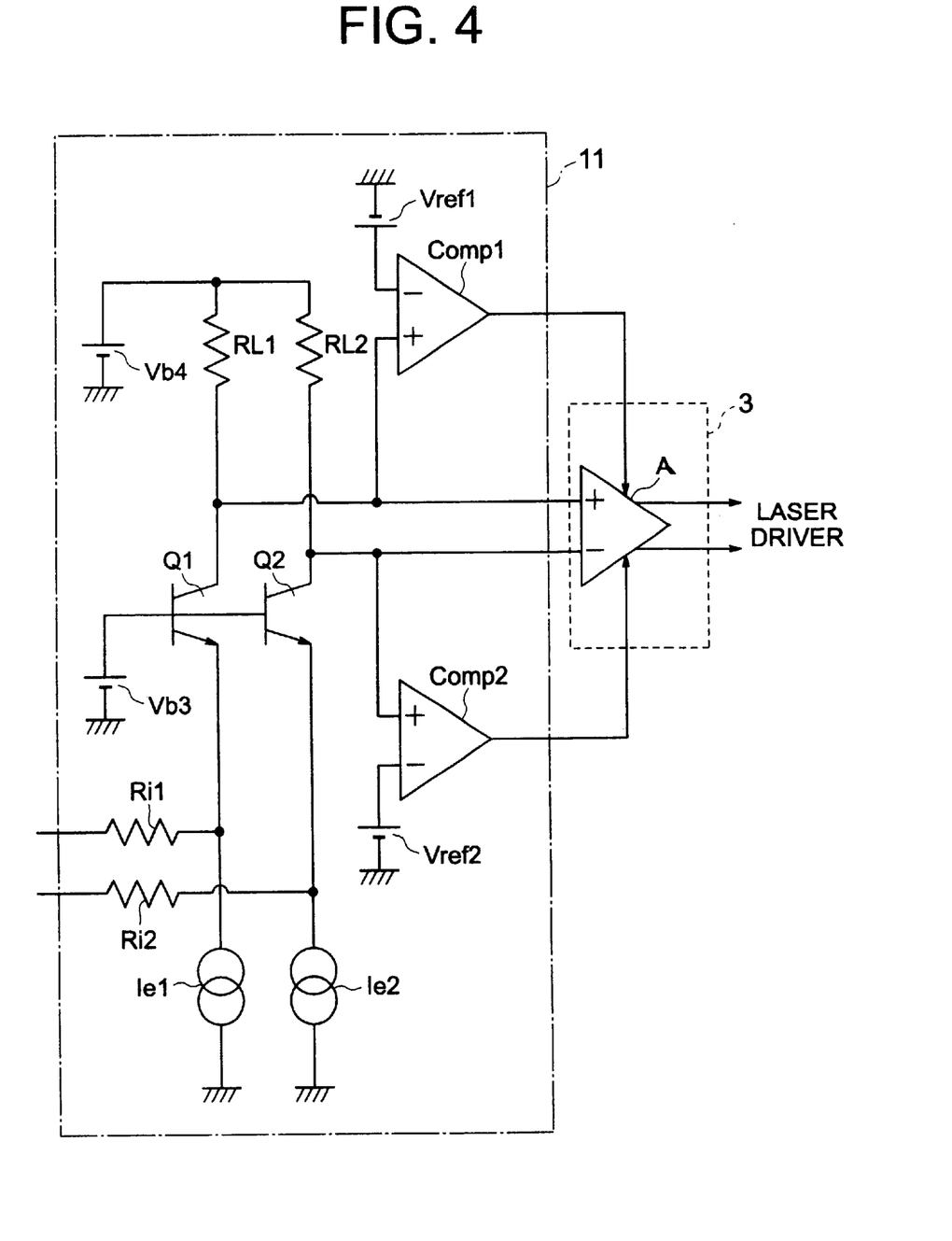
FIG. 4 is a circuit configuration diagram for explaining a third embodiment of the present invention.

FIG. 4 is a circuit diagram for explaining a third embodiment of the present invention. Whereas FIGS. 1 and 3 judge with the voltages at the input terminals of the LVDS receiver 3, the present embodiment detects the open state of the input end by the current flowing in or out the input end of the protector 11. FIG. 4 shows only the protector 11 and the LVDS receiver 3 for explanation.

In the configuration of FIG. 4, the protector 11 is one due to current to voltage conversion. That is, a common base of transistors Q1 and Q2 is connected to a bias voltage source Vb3, the respective current sources Ie1 and Ie2 being connected to each emitter thereof, collectors thereof being connected to a bias voltage source Vb4 through each resistance RL1 and RL2. Thereby, a common base circuit is constituted. Here, input ends thereof are connected to emitters of transistors Q1 and Q2 through resistance Ri1 and Ri2 respectively, collector outputs of the transistor Q1 and Q2 being inputs of the differential input/output amplifier A.

In the present constitution, the voltage of the bias voltage Vb3 is set so that emitter voltages of the transistor Q1 and Q2 become outside of the range of LVDS standard, in other words, outside of the range between the $VOH_{MAX}$ and $VOL_{MIN}$ of FIG. 2. There, the comparators Comp 1 and Comp 2 detect whether the collector voltages of the transistors Q1 and Q2 are in the prescribed range or not. Thereby, the open state of the input end can be detected.

For instance, when detected to be open, the collector voltages of the transistors Q1 and Q2 go up, and when being normal, the voltages thereof go down. The comparators Comp 1 and Comp 2 detect this voltage variation. Accordingly, when the open state is detected, the detected output controls the output of the differential input/output amplifier A so that the laser becomes a non-emitting state. Thereby, accidents due to the laser light can be prevented from occurring.

In embodiments shown in FIGS. 1 and 3, since the terminal resistance Rt is disposed between the input terminals of the LVDS receiver 3, both of the input ends, when being simultaneously open, can be easily detected. However, when only one input end is open, unless a certain degree of large voltage is generated between both ends of the terminal resistance Rt, one input end can not be detected to be open. Accordingly, in setting so that a constant enables such situations, some devices are necessary. Specifically, for the case of FIG. 1, values of resistances Rb1 and Rb2 must be set lower, and for the case of FIG. 3, values of currents of current sources I1 and I2 must be set larger.

In the case of FIG. 4, by making use of the resistances Ri1 and Ri2 as the terminal resistance Rt, only one input end being open can be relatively easily detected. However, in all cases of FIGS. 1 and 3 where the constants are set anew, and of FIG. 4, load of the LVDS transmitter 2 becomes larger.

Figure 5:
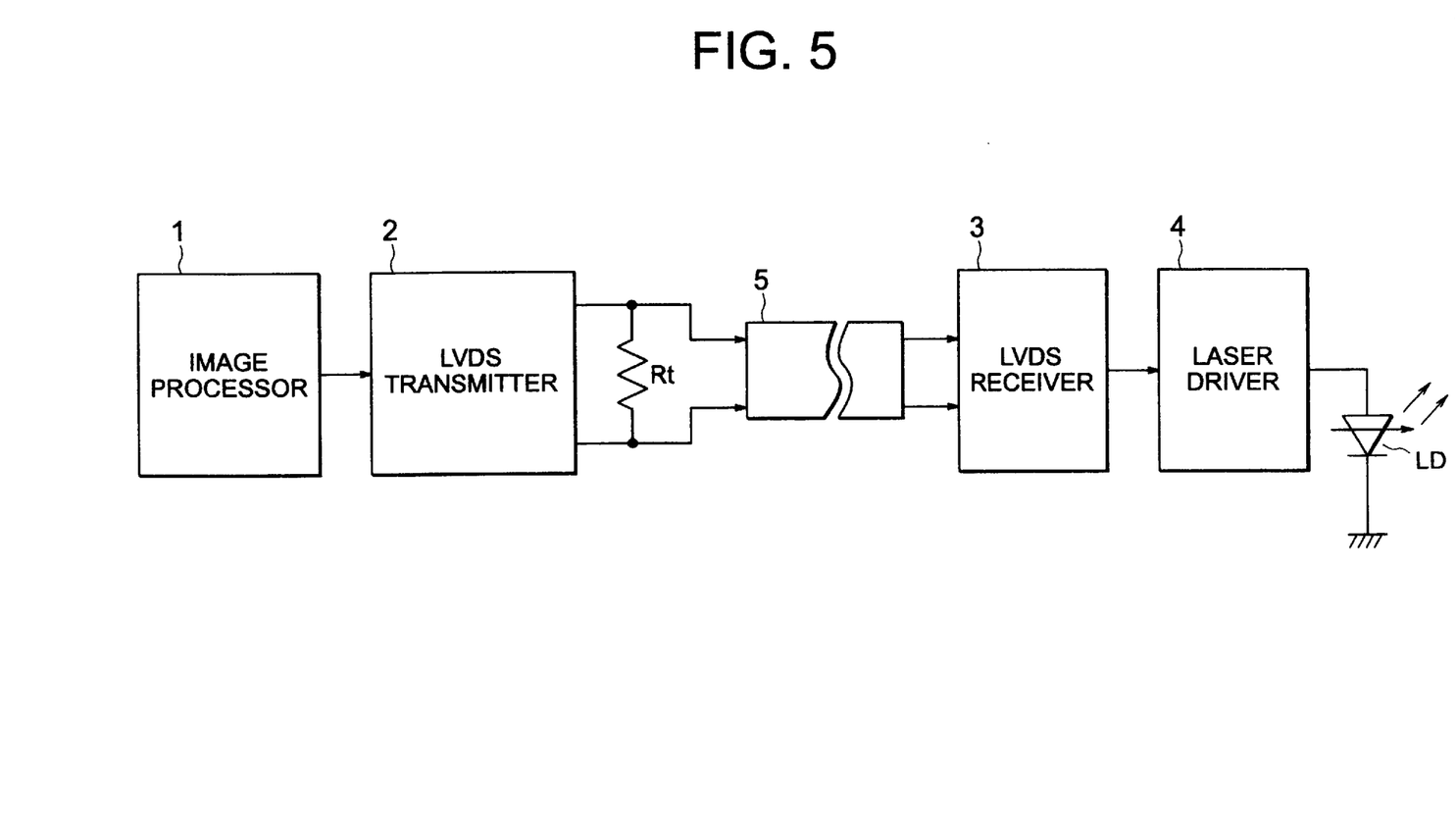
FIG. 5 is a system block diagram for explaining a fourth embodiment of the present invention.

FIG. 5 is a system diagram for explaining a fourth embodiment of the present invention. The present embodiment, without increasing the load of the LVDS transmitter 2, enables to detect only one input end being open.

That is, in the embodiment, the terminal resistance Rt of FIG. 6 is moved from between the input terminals of the LVDS receiver 3 to between the output terminals of the LVDS transmitter 2.

When the terminal resistance Rt is at the input terminal of the LVDS receiver 3, since even if the cable 5 is disconnected the terminal resistance Rt is connected, the cable 5 is difficult to detect being disconnected. However, when the terminal resistance Rt is disposed at the output terminal of the LVDS transmitter 2, even if one side of the balanced line of the cable 5 between the LVDS transmitter 2 and the LVDS receiver 3 is disconnected, the input terminal of the LVDS receiver 3 becomes an open state. Accordingly, the cable 5 can be easily detected being disconnected.

This, even in embodiments shown in FIGS. 1, 3 and 4, shows that disposition of the terminal resistance Rt at the output terminal side of the LVDS transmitter 2 enables to detect easily the LVDS receiver 3 side.

The terminal resistance Rt can be disposed at, other than between the output terminals of the LVDS transmitter 2, between the LVDS signal lines of the cable 5.

As explained above, the present invention includes all the cases where, by making use of the LVDS standard, the LVDS receiver input end itself or a portion corresponding thereto, when the input end side of the LVDS receiver is open, is made a bias state different from during normal connection, according to the detected results the output state of the differential input/output amplifier A being controlled.

The present invention, though explained with embodiments that can prevent accidents due to the laser light from occurring, is not restricted to those. The present invention also includes the cases where data are transmitted by the use of the LVDS and fail-safe during extraordinary state is required.

The present invention can be also applied in the case where differential signal similar to the LVDS is transmitted.

As explained above, according to the protector of the present invention, without damaging high-speed data transmission due to the LVDS, the accidents due to the laser light during for instance maintenance operation can be prevented from occurring.

While the invention has been described in terms of specific embodiments thereof, it is not intended to be limited thereto but rather only to the extent set forth hereafter in the following claims.

What is claimed is:

1. A protecting unit applied in an instrument comprising an input end to which a differential signal is transmitted, which is then supplied to a differential input/output circuit, the input end being attachable to and detachable from an input line, the protecting unit comprising:

a circuit configured to set a voltage at the input end when the input line is not connected to a voltage value different from that generated at the input end when the input. line is connected; and a comparator for comparing a voltage at the input end with a reference voltage;

wherein a state of output of the differential imput/lutput circuit is fixed to a prescribed state based on a compared result.

2. The protecting unit as set forth in claim 1, wherein the voltage setting circuit sets the voltage at the input end when the input line is not connected to a voltage higher than a maximum of voltages generated at the input end when the input line is connected, and the comparator compares the voltage at the input end with a value between the set voltage value and a maximum value of voltages generated at the input end when the input line is connected as a value of the reference voltage.

3. The protecting unit as set forth in claim 1, wherein the differential signal is LVDS (Low Voltage Differential Signal) provided by IEEE.

4. The protecting unit as set forth in claim 1, wherein between both phases of the differential signal a resistance is inserted.

5. The protecting unit as set forth in claim 1, wherein output of the differential input/output circuit is used to let a laser diode emit.

6. A protecting unit applied in an instrument comprising an input end to which a differential signal is transmitted, which is then supplied to a differential input/output circuit, the input end being attachable to and detachable from an input line, the protecting unit comprising:

a circuit configured to set a voltage at the input end when the input line is not connected to a voltage value different from that generated at the input end when the input line is connected;

a node for detecting a voltage at the input end; and a comparator for comparing a voltage at the node with a reference voltage;

wherein a state of output of the differential input/output circuit is fixed to a prescribed state based on a compared result.

7. The protecting unit as set forth in claim 6, wherein the voltage setting circuit exists at least one end of the input end pair; and the comparator compares about the voltage of the node disposed at least one side of the input end pair.

8. The protecting unit as set forth in claim 6, wherein the voltage setting circuit comprises a voltage source and a resistance connected to the voltage source.

9. The protecting unit as set forth in claim 6, wherein the voltage setting circuit comprises a current source.

10. The protecting unit as set forth in claim 6, wherein the voltage setting circuit sets the voltage at the input end when the input line is not connected to a voltage higher than a maximum of voltages generated at the input end when the input line is connected, and the comparator compares the voltage at the node with a value between the set voltage value and a maximum value of voltages generated at the input end when the input line is connected as a value of the reference voltage.

11. The protecting unit as set forth in claim 6, wherein the differential signal is LVDS (Low Voltage Differential Signal) provided by IEEE.

12. The protecting unit as set forth in claim 6, wherein between both phases of the differential signal a resistance is inserted.

13. The protecting unit as set forth in claim 6, wherein output of the differential input/output circuit is used to let a laser diode emit.

14. A protecting unit applied in an instrument comprising an input end to which a differential signal is transmitted, the input end being attachable to and detachable from an input line, the protecting unit comprising:

a bias circuit configured to set a voltage at the input end when the input line is not connected to a voltage value different from that generated at the input end when the input line is connected;

a transmitter for transmitting variation of voltage at the input end to an input terminal of a differential input/output circuit; and a comparator for comparing a voltage at the input terminal of the differential input/output circuit with a reference voltage;

wherein a state of output of the differential input/output circuit is fixed to a prescribed state based on a compared result.

15. The protecting unit as set forth in claim 14, wherein the transmitter includes a current to voltage converter.

16. The protecting unit as set forth in claim 15, wherein the current to voltage converter is a common base amplifier.

17. The protecting unit as set forth in claim 16, wherein the bias circuit includes a voltage source connected to a base of the common base amplifier.

18. The protecting unit as set forth in claim 14, wherein the differential signal is LVDS (Low Voltage Differential Signal) provided by IEEE.

19. The protecting unit as set forth in claim 14, wherein between both phases of the differential signal a resistance is inserted.

20. The protecting unit as set forth in claim 14, wherein output of the differential input/output circuit is used to let a laser diode emit.

* * * * *

UNITED STATES PATENT AND TRADEMARK OFFICE
CERTIFICATE OF CORRECTION

PATENT NO.   : 6,486,695 B1  Page 1 of 1
DATED        : November 26, 2002
INVENTOR(S)  : Chikashi Nakagawara It is certified that error appears in the above-identified patent and that said Letters Patent is hereby corrected as shown below:

<u>Column 7,</u>
Line 2, please change "imput/lutput" to -- input/output --.

Signed and Sealed this

Seventeenth Day of June, 2003

JAMES E. ROGAN
*Director of the United States Patent and Trademark Office*